(12) United States Patent
Nicholson

(10) Patent No.: US 12,399,810 B2
(45) Date of Patent: Aug. 26, 2025

(54) TESTING SYSTEM WITH TEST RIG

(71) Applicant: The Boeing Company, Chicago, IL (US)

(72) Inventor: Michael Foster Nicholson, Media, PA (US)

(73) Assignee: The Boeing Company, Chicago, IL (US)

(*) Notice: Subject to any disclaimer, the term of this patent is extended or adjusted under 35 U.S.C. 154(b) by 244 days.

(21) Appl. No.: 17/935,534

(22) Filed: Sep. 26, 2022

(65) Prior Publication Data

US 2024/0104010 A1 Mar. 28, 2024

(51) Int. Cl.
*G06F 11/3668* (2025.01)
*G01R 31/00* (2006.01)
*G01R 31/01* (2020.01)

(52) U.S. Cl.
CPC ........ *G06F 11/3696* (2013.01); *G01R 31/003* (2013.01); *G01R 31/01* (2013.01)

(58) Field of Classification Search
CPC ............. G06F 11/3696; G06F 11/3668; G01R 31/003; G01R 31/01
See application file for complete search history.

(56) References Cited

U.S. PATENT DOCUMENTS

| 8,977,391 B2 | 3/2015 | VaVrina et al. |
| 2004/0077200 A1* | 4/2004 | Ishikawa ................ G01R 31/01 439/190 |
| 2018/0184732 A1* | 7/2018 | Plant ........................ B32B 3/26 |
| 2022/0185451 A1* | 6/2022 | Farrell ....................... B64F 5/60 |

FOREIGN PATENT DOCUMENTS

| CN | 108563569 A * | 9/2018 | .......... G06F 11/3644 |
| CN | 114840977 A * | 8/2022 | |

OTHER PUBLICATIONS

Translation of CN-108563569-A 2018.*
Translation of CN-114840977-A 2022.*
Wikipedia, "V-Model," Wikimedia Foundation, Inc., last edited on Jul. 21, 2022, accessed Sep. 26, 2022, 8 pages. https://en.wikipedia.org/wiki/V-Model.

* cited by examiner

*Primary Examiner* — Manuel L Barbee
(74) *Attorney, Agent, or Firm* — Yee & Associates, P.C.

(57) ABSTRACT

A testing system and methods of testing interfaces of a subsystem are presented. The testing system is configured to test a subsystem prior to assembly into a system, the testing system comprising a test rig comprising electrical wiring and a mechanical restraint configured to emulate at least one physical specification of the structure; and a virtual software environment developed to emulate operating software for of the system.

29 Claims, 12 Drawing Sheets

TESTING SYSTEM WITH TEST RIG

BACKGROUND INFORMATION

1. Field

The present disclosure relates generally to systems engineering and more specifically to a testing system and test rig for interface discovery in systems engineering.

2. Background

Conventional systems engineering utilizes a V model. In the V model, design and decomposition of a system are performed first. After design, the components, and subsystems are procured and built. Testing is performed after design and building.

An alternative to a conventional V model is an agile model. The agile model follows the same sequence as the systems V, but the V is performed for smaller pieces of the overall system. The agile development method performs several iterations of the systems V to complete a project.

During testing in either the agile model or the V model, interface control documents for subsystems are developed and tested. Interface control documents describe the inputs and outputs of the subsystem. Documented interfaces serve as a foundation for system design. If a subsystem does not operate according to the interface control documents, the design of the system will need to be modified. Within the aerospace industry, interface non-conformances are often found in final build and test phases. The corrective actions for non-conformances during final assembly of an aircraft or space vehicle can lead to an undesirable amount of unplanned time and expense.

Therefore, it would be desirable to have a method and apparatus that takes into account at least some of the issues discussed above, as well as other possible issues.

SUMMARY

An embodiment of the present disclosure provides a testing system configured to test a subsystem prior to assembly into a structure, the testing system comprises a test rig comprising electrical wiring and a mechanical restraint configured to emulate at least one physical specification of the structure; and a virtual software environment developed to emulate operating software for the system.

Another embodiment of the present disclosure provides a method of testing a subsystem. Input is received at a virtual software environment to generate a command for the subsystem. The virtual software environment responsively generates a command to send to the subsystem. The output from the subsystem is received. It is determined if there is an inconsistency between the output from the subsystem and interface control documents of the subsystem.

A further embodiment of the present disclosure provides a method of testing a subsystem prior to installation in a system. An interface control document for the subsystem is received. The subsystem is positioned onto a test rig configured to provide mechanical emulation of the system. Validation of the interface control document for the subsystem is performed using the test rig and a virtual software environment developed to emulate software for the system.

A yet further embodiment of the present disclosure provides a method of system design for a system. Specifications for the system are received. Specifications for subassemblies of the system are developed from the specifications of the system. Validation of an interface control document of a subsystem to be used in the system is performed to determine modifications to one of the interface control document or a design for the system. The modifications are incorporated into at least one of the interface control document or the design for the system.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

The illustrative examples recognize and take into account one or more different considerations. The illustrative examples recognize and take into account that as systems become increasingly more sophisticated and complex, the methodologies for designing and integrating these systems should evolve to maintain high levels of first-time quality. The illustrative examples recognize and take into account that when integrating complex new subsystems into a complex system, the present state-of-the-art delays discovery of interface issues. The illustrative examples recognize and take into account that discovery of interface non-conformances prior to subsystem design would be desirable. The illustrative examples recognize and take into account that issues integrating complex new subsystems can lead to schedule delay to rework the design, or system delivery to a customer with undesirable quality. The illustrative examples recognize and take into account that issues integrating complex new subsystems can result in cost and schedule overruns.

The illustrative examples present a testing system and methods for interface control document validation. The illustrative examples present processes of evaluating a subsystem in an isolated configuration to ensure that it meets the behaviors allocated to it in a system design. The process of interface control document validation in the illustrative examples tests a subsystem-unique interface control document. The subsystem interface control document describes the details of the data crossing the interface(s), and allocates functions to each subsystem within the design. The illustrative examples are configured to perform interface control document validation to exercise each aspect of the subsystem's interface individually in accordance with the system-unique interface control document.

Figure 1:
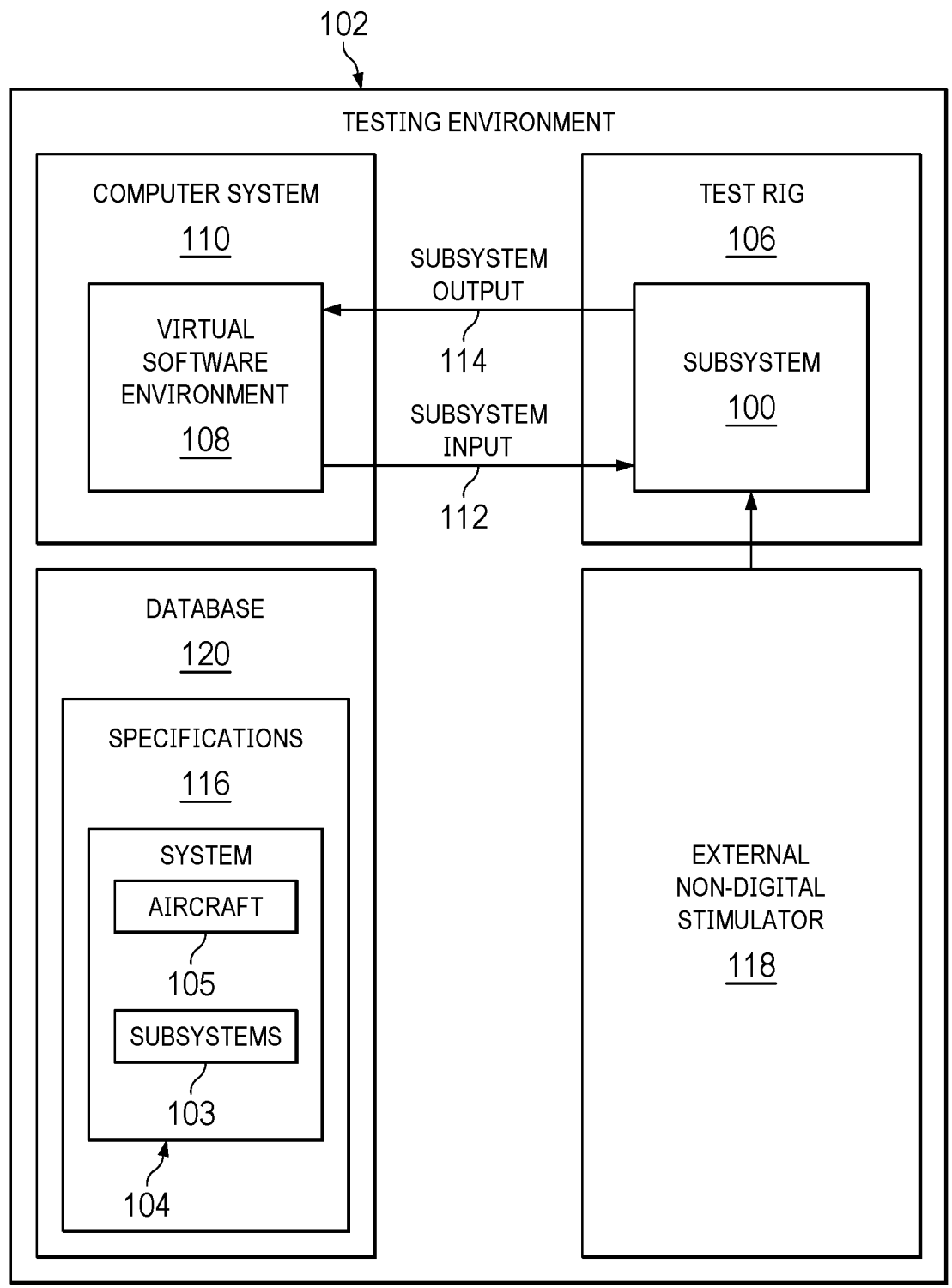
FIG. 1 is an illustration of a block diagram of a testing environment in which an illustrative embodiment may be implemented.

Turning now to FIG. 1, an illustration of a block diagram of a testing environment is depicted in which an illustrative embodiment may be implemented. An interface control document of subsystem 100 is validated in testing environment 102. Subsystem 100 will desirably be used in system 104. Subsystem 100 is one of subsystems 103 of system 104. In some illustrative examples, system 104 is being designed and subsystem 100 is a desired part for system 104. In some illustrative examples, system 104 has been designed and subsystem 100 is an aftermarket part. In some illustrative examples, system 104 takes the form of aircraft 105.

Although the illustrative examples are described with respect to an aircraft, an illustrative embodiment may be applied to other types of platforms. The platform may be, for example, a mobile platform, a stationary platform, a land-based structure, an aquatic-based structure, or a space-based structure. More specifically, the platform may be a surface ship, a tank, a personnel carrier, a train, a spacecraft, a space station, a satellite, a submarine, an automobile, a power plant, a bridge, a dam, a house, a manufacturing facility, a building, and other suitable platforms.

Subsystem 100 is physically connected to test rig 106. Test rig 106 is a mechanical rig that provides physical connections to subsystem 100. In some illustrative examples, the physical connections in test rig 106 comprise at least one of utility connections or mechanical restraint. Utility connections can include at least one of electrical wiring, pneumatic connections, hydraulic connections, a water source, a vacuum source, or any other desirable utility connection.

Virtual software environment 108 is present in computer system 110. Virtual software environment 108 creates a communication connection to subsystem 100. In some illustrative examples, the communication connection is wireless. In some illustrative examples, the communication connection between virtual software environment 108 and subsystem 100 is formed of wires independent of test rig 106. In some illustrative examples, connecting wires from test rig 106 to virtual software environment 108 creates a communication connection to subsystem 100. Virtual software environment 108 provides subsystem input 112 to validate the interface control document of subsystem 100. Virtual software environment 108 receives subsystem output 114 to validate the interface control document of subsystem 100.

In some illustrative examples, the physical connections of test rig 106 are configured based on specifications 116 for system 104. In some illustrative examples, specifications 116 are part of a preliminary design for system 104. In some illustrative examples, specifications 116 are for system 104 that has been assembled. Virtual software environment 108 provides subsystem input 112 configured to mimic operating conditions of system 104. The digital interface between subsystem 100 and computer system 110 could be MIL-STD-1553 wiring, ARINC-429 wiring, or ethernet wiring. Virtual software environment 108 is configured to adapt to any of these interfaces.

Virtual software environment 108 emulates algorithms and logic planned for one of subsystems 103 that will interface with subsystem 100, before design for system 104 has begun, and serves to digitally stimulate subsystem 100. In these illustrative examples, virtual software environment 108 is configured to emulate software logic and algorithms that have not yet been coded. Virtual software environment 108 is a software package that provides a graphical user interface for an operator to use to control virtual software environment 108 to assess behavior of subsystem 100.

Test rig 106 is configured to mimic operating conditions of system 104. In some illustrative examples, the mechanical rig, test rig 106, holds subsystem 100. Depending on the details of subsystem 100, test rig 106 can also emulate other aspects of system 104. In some illustrative examples, test rig 106 emulates electrical signal inputs to subsystem 100, such as discrete (i.e., switches) or analog signals. In some illustrative examples, test rig 106 generates Radio Frequency (RF) energy from a radio transmitter. In some illustrative examples, test rig 106 includes thermal management provisions, such as fans. In some illustrative examples, test rig 106 includes components to simulate motion. In some illustrative examples, system 104 is aircraft 105 and test rig 106 includes components to emulate aircraft pitch and roll.

In some illustrative examples, test rig 106 provides stimulation to introduce undesirable conditions into subsystem 100. In some illustrative examples, test rig 106 comprises stimulation to introduce opens or shorts to subsystem 100. In some illustrative examples, test rig 106 comprises stimulation to introduce overheating to subsystem 100.

In some illustrative examples, external non-digital stimulator 118 provides external forces acting upon subsystem 100. In some illustrative examples, external non-digital stimulator 118 is provided to mimic operating conditions of system 104. In some illustrative examples, external non-digital stimulator 118 is provided to test the interface control document of subsystem 100.

In some illustrative examples, external non-digital stimulator 118 is optional. In some illustrative examples, virtual software environment 108 sends stimulation to subsystem 100, wherein the stimulation emulates input for subsystem 100 from a physical piece of equipment.

In some illustrative examples, virtual software environment 108 is configured to provide emulation of at least one of electrical, mechanical, kinetic, digital, and thermodynamic inputs from a component of system 104 or commands from a component of system 104. In some illustrative examples, virtual software environment 108 emulates stimulation for a sensor of subsystem 100. In these illustrative examples, external non-digital stimulator 118 is optional.

FIG. 1 shows a simplified block diagram of a virtual software environment and subsystem interface control document validation setup. The illustration of testing environment 102 in FIG. 1 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, a display (not depicted) can be connected to virtual software environment 108. In these illustrative examples, virtual software environment 108 can display commands for and results from testing subsystem 100.

Figure 2:
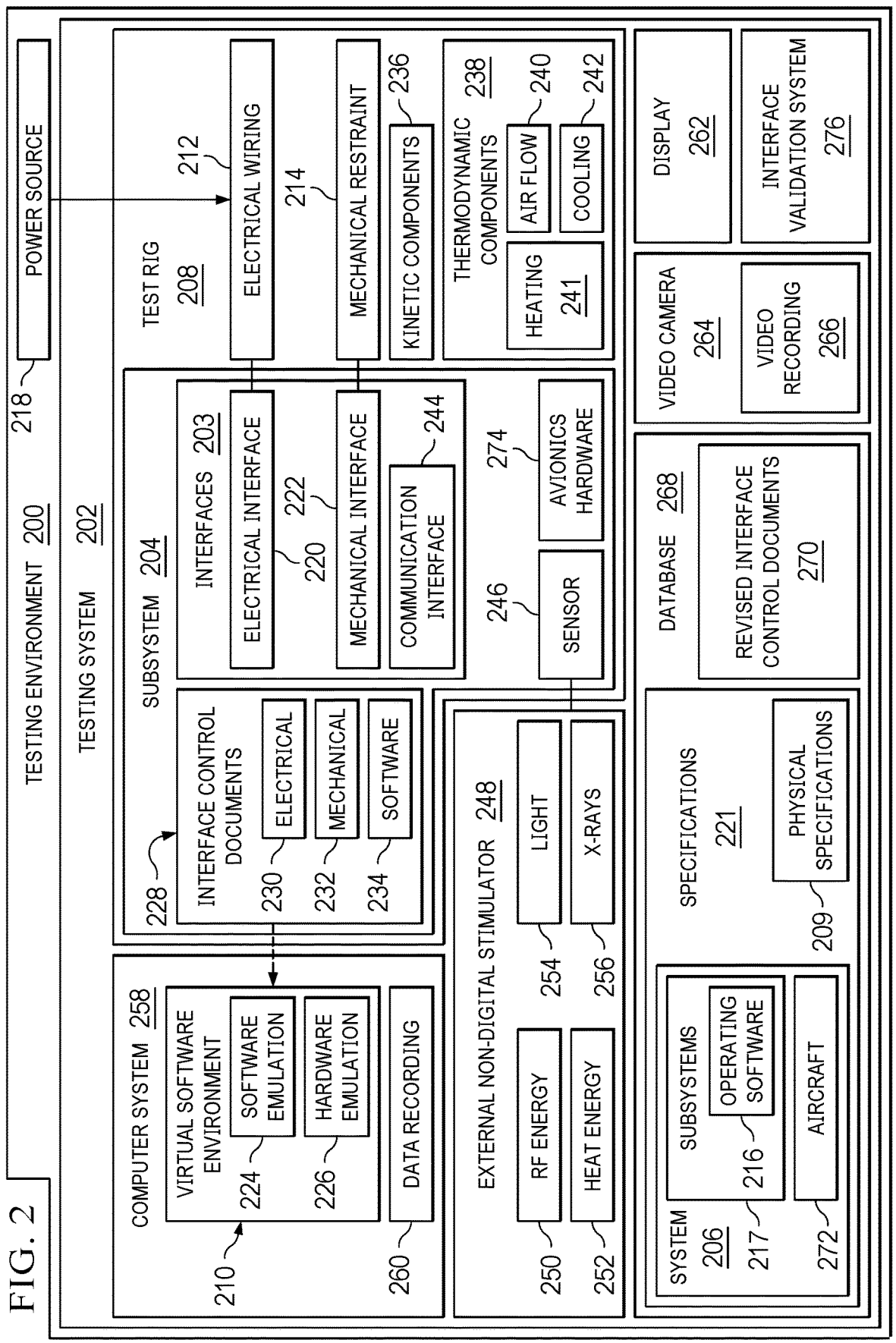
FIG. 2 is an illustration of a block diagram of a testing environment in which an illustrative embodiment may be implemented.

Turning now to FIG. 2, an illustration of a block diagram of a testing environment is depicted in which an illustrative embodiment may be implemented. Testing environment 200 includes testing system 202 to test subsystem 204. In some illustrative examples, testing environment 200 is the same as testing environment 102 of FIG. 2.

Testing system 202 in testing environment 200 is configured to test subsystem 204 prior to assembly into system 206. More specifically, testing system 202 in testing environment 200 is configured to test interfaces 203 of subsystem 204 prior to assembly into system 206. Testing system 202 comprises physical and software components. Testing system 202 comprises physical and software components to emulate at least one of electrical, mechanical, kinetic, digital, and thermodynamic inputs for subsystem 204.

Testing system 202 comprises test rig 208 and virtual software environment 210. Test rig 208 comprises electrical wiring 212 and mechanical restraint 214 configured to emulate at least one of physical specifications 209 of system 206. Virtual software environment 210 is developed to emulate operating software 216 and/or hardware for system 206 in software emulation 224 and/or hardware emulation 226.

Operating software 216 is one of subsystems 217 of system 206. Subsystem 204 is a physical implementation of one of subsystems 217 to be used in system 206.

Virtual software environment 210 emulates algorithms and logic planned for a subsystem of subsystems 217 that will interface with subsystem 204, before design of system 206 has begun, and serves to digitally stimulate subsystem 204. Virtual software environment 210 is a software package that provides a graphical user interface for an operator to use to control virtual software environment 210 in order to assess behavior of subsystem 204. Virtual software environment 210 is a software package that allows for testing of subsystem 204 with the interfacing algorithms and logic intended to be developed for operating software 216.

In some illustrative examples, test rig 208 is an implementation of test rig 106 of FIG. 1. In some illustrative examples, virtual software environment 210 is an implementation of virtual software environment 108 of FIG. 1.

Power source 218 provides power to electrical wiring 212 of test rig 208. Test rig 208 is a mechanical rig. Test rig 208 is configured to emulate at least one of physical specifications 209 of system 206. In some illustrative examples, physical specifications 209 comprises at least one of dimensions within system 206 for subsystem 204, types of electrical connections, types of electrical wiring, voltage and current of provided power, an operating temperature, movement of system 206, or other utilities.

To test interfaces 203 of subsystem 204, electrical wiring 212 of test rig 208 is connected to electrical interface 220 of subsystem 204. In some illustrative examples, electrical wiring 212 is designed as the electrical wiring in specifications 221 of system 206. For example, electrical wiring 212 can include the same quantity, size, and design as electrical wiring in specifications 221 of system 206. To test interfaces 203 of subsystem 204, mechanical restraint 214 of test rig 208 is connected to mechanical interface 222 of subsystem 204.

Operating software 216 is the software that will be in use in system 206 during operation of system 206. Operating software 216 is designed for system 206. In some illustrative examples, operating software 216 has not yet been programmed. In these illustrative examples, virtual software environment 210 is configured to emulate software logic and algorithms that have not yet been coded.

Virtual software environment 210 provides software emulation 224 of operating software 216 and hardware emulation 226. Hardware emulation may emulate input for subsystem 204 from a physical piece of equipment planned for subsystems 217. Virtual software environment 210 is a package of tools developed to model the operating software 216 that will be developed later, during the build phase of the program. The models of virtual software environment 210 are used to emulate the timing, interface data structures, control algorithms, data processing, and display capabilities of the planned software, operating software 216. Virtual software environment 210 allows any of these aspects of the emulated operating system to be rapidly modified when a design change is identified by the testing of subsystem 204.

Testing of subsystem 204 comprises validation of interface control document 228 for subsystem 204. In some illustrative examples, testing subsystem 204 is called interface control document validation. Interface control document 228 describes the inputs and outputs of subsystem 204. Interface control document 228 includes at least one of electrical 230, mechanical 232, or software 234 inputs and outputs.

In some illustrative examples, test rig 208 further comprises kinetic components 236 configured to generate movement of test rig 208 and subsystem 204. In some illustrative examples, kinetic components 236 are configured to provide input to validate operation of subsystem 204. For example, if subsystem 204 is a system to measure or detect motion, kinetic components 236 provide input to subsystem 204.

In some illustrative examples, test rig 208 comprises kinetic components 236 configured to emulate motions of system 206 while system 206 is in operation. For example, kinetic components 236 can generate motion of test rig 208 to verify operation of subsystem 204 with expected motions of system 206 during operation. In some illustrative examples, system 206 takes the form of aircraft 272. In some illustrative examples, kinetic components 236 are configured to generate motions to emulate operations of aircraft 272.

In some illustrative examples, test rig 208 further comprises thermodynamic components 238. In some illustrative examples, thermodynamic components 238 are configured to emulate operational thermodynamic conditions of system 206. In some illustrative examples, test rig 208 further comprises thermodynamic components 238 configured to provide thermal management of subsystem 204. In some illustrative examples, thermodynamic components 238 provide air flow 240 to provide thermal management of subsystem 204. In some illustrative examples, thermodynamic components 238 provide at least one of heating 241 or cooling 242 to emulate operational thermodynamic conditions of system 206. In some illustrative examples, thermodynamic components 238 provide at least one of heating 241 or cooling 242 to provide thermal management of subsystem 204.

Subsystem 204 comprises communication interface 244. Subsystem 204 communicates with virtual software environment 210 via communication interface 244. Communication interface 244 takes any desirable form, such as high speed ethernet, wireless, military standard databus, or commercial serial.

In some illustrative examples, subsystem 204 has sensor 246. Sensor 246 is configured to detect any desirable type of input. In some illustrative examples, external non-digital stimulator 248 is provided to stimulate sensor 246. In some illustrative examples, external non-digital stimulator 248 is provided to test operation of subsystem 204 when non-digital stimulation is present. In some illustrative examples, external non-digital stimulator 248 is configured to generate one of RF energy 250 or heat energy 252. In some illustrative examples, external non-digital stimulator 248 is provided to emulate operational parameters of system 206. In some illustrative examples, external non-digital stimulator 248 is configured to generate a stimulus for subsystem 204. In some illustrative examples, external non-digital stimulator 248 generates at least one of radio frequency (RF) energy 250, heat energy 252, light 254, or x-rays 256.

In some illustrative examples, virtual software environment 210 is further configured to provide emulation of at least one of data from a component of system 206 or commands from a component of system 206. In some illustrative examples, virtual software environment 210 emulates stimulation for sensor 246. In these illustrative examples, external non-digital stimulator 248 is optional. In another illustrative example, virtual software environment 210 sends input to communication interface 244 that emulates input from a component of aircraft 272. In some illustrative examples, virtual software environment 210 sends stimulation to subsystem 204 wherein the stimulation emulates input for subsystem 204 from a physical piece of equipment.

As depicted, virtual software environment 210 is present in computer system 258. As virtual software environment 210 performs tests on subsystem 204, virtual software environment 210 creates data recording 260 of results. Data recording 260 enables operators to review results after testing of subsystem 204. As virtual software environment 210 performs tests on subsystem 204, virtual software environment 210 displays inputs and outputs for subsystem 204 on display 262 in real time. During testing of subsystem 204, operators can view inputs and outputs for subsystem 204 on display 262 to review results of testing using virtual software environment 210.

In some illustrative examples, video camera 264 is present in testing system 202. Video camera 264 is configured to record results of testing subsystem 204. In some illustrative examples, video camera 264 is directed towards subsystem 204 within testing system 202. In some illustrative examples, video camera 264 is directed towards display 262 and subsystem 204 within testing system 202. Video camera 264 generates video recording 266 during testing of subsystem 204. Video recording 266 can be reviewed after testing to observe behavior of subsystem 204 during testing.

For an interface control document validation test, expected results are developed from interface control documents 228 supplied with subsystem 204. The expected results allow validation of the behaviors of subsystem 204 within testing system 202. When inconsistencies are discovered, changes can be made to at least one of specifications 221 of system 206, software logic and algorithms in software emulation 224, or interface control documents 228. In some illustrative examples, modifications are incorporated into interface control documents 228 to form revised interface control documents 270 based on the inconsistency.

Each aspect of interface control documents 228 is tested by testing subsystem 204. In some illustrative examples, testing of subsystem 204 is performed one interface at a time. A number of examples of tests to be performed on subsystem 204 is provided below:

In one example, subsystem 204 is tested for initialization time. In one example, subsystem 204 is expected to complete initialization within N seconds. In this example, N is a placeholder for a set value within interface control documents 228. In this example, virtual software environment 210 will monitor outputs of subsystem 204 received from an interface between subsystem 204 and virtual software environment 210 for an output that indicates "initialization complete' and provides the measured initialization time.

In some illustrative examples, if subsystem 204 exceeds the initialization time provided in interface control documents 228, specifications 221 of system 206 are modified. In some illustrative examples, a subsystem control model of virtual software environment 210 will be rapidly adjusted to test subsystem 204 with this updated expectation. In some illustrative examples, the planned system behaviors of operating software 216 will be updated to reflect this new understanding of the initialization time of subsystem 204, prior to software coding of operating software 216. In some illustrative examples, interface control documents 228 are modified to form revised interface control documents 270 with the updated initialization time of subsystem 204.

In another example, subsystem 204 is tested for current draw. In one example, subsystem 204 is expected to draw a maximum of N Amps of DC current.

As the virtual software environment 210 controls all the modes and events available with subsystem 204, a current monitor is used to measure the power draw for subsystem 204. If subsystem 204 exceeds the maximum power draw specified in interface control documents 228, then a modification is made to electrical 230 interface control document, and the electrical system specifications for aircraft 272 are modified to accommodate the actual behavior of subsystem 204. In some illustrative examples, a wiring design for system 206 in specifications 221 is adjusted to ensure that an electrical circuit breaker for subsystem 204 in system 206 is properly sized. In some illustrative examples, the measured power draw is used in the design of the electrical system of system 206 to ensure that system 206 can provide the power required by subsystem 204.

For an interface control document validation test, expected results are developed from interface control documents 228 for subsystem 204. The following are examples of expected results for subsystem 204.

In one example, subsystem 204 is expected to change from Mode A to Mode B when data bit C is set to 1 using communication interface 244. Virtual software environment 210 will command subsystem 204 to Mode B by setting data bit C, in accordance with interface control documents 228. If a subsystem monitor model of virtual software environment 210 displays that subsystem 204 has failed to transition to Mode B with the specified command, an investigation will be performed.

If the investigation reveals that Mode B requires both data bits C AND D to be set to 1, then a subsystem control model of virtual software environment 210 will be adjusted to test this. The planned system behaviors of operating software 216 will be updated to reflect this new understanding, prior to software coding.

In some illustrative examples, system 206 takes the form of aircraft 272. Aircraft 272 is a complex system. By modifying specifications 221 prior to building aircraft 272, significant manufacturing time and resources can be saved. By modifying operating software 216 based on unexpected results of interface control document validation, significant programming time can be saved.

Validating interface control documents 228 using test rig 208 and virtual software environment 210 can improve technical quality. Validating interface control documents 228 using test rig 208 and virtual software environment 210 leads to cost savings and schedule gains.

Figure 3:
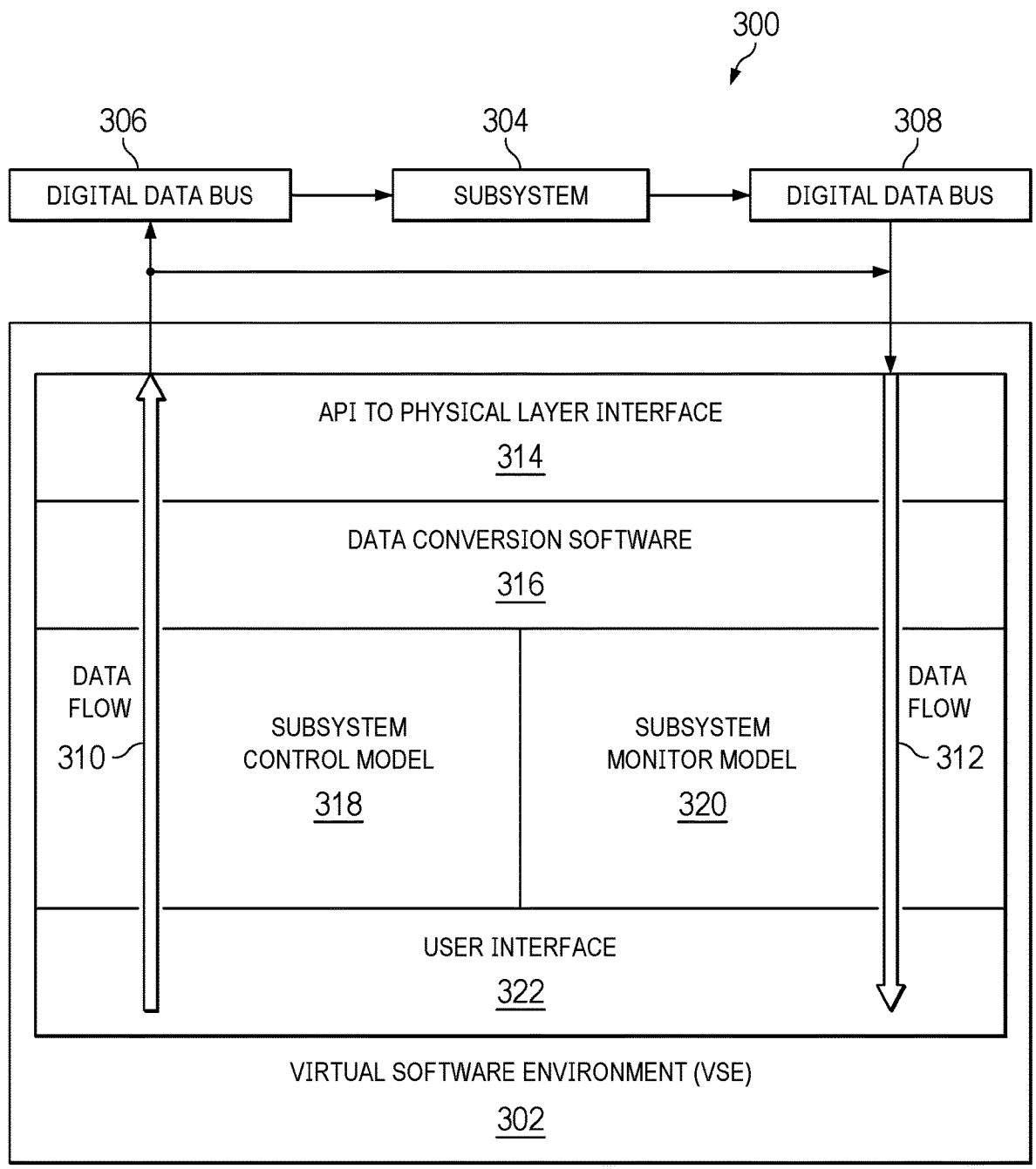
FIG. 3 is an illustration of a block diagram of a data flow of a virtual software environment in accordance with an illustrative embodiment.

Turning now to FIG. 3, an illustration of a block diagram of a data flow of a virtual software environment is depicted in accordance with an illustrative embodiment. Data flow 300 can be implemented in virtual software environment 108 of FIG. 1 or virtual software environment 210 of FIG. 2. Data flow 300 demonstrates movement of data between virtual software environment (VSE) 302 and subsystem 304.

Digital data bus 306 provides data flow 310 from virtual software environment 302 to subsystem 304. Digital data bus 308 sends data flow 312 from subsystem 304 to virtual software environment 302.

Virtual software environment 302 comprises several layers. Data flow 312 from subsystem 304 travels through an Application Programming Interface (API) to physical layer interface 314, data conversion software 316, subsystem monitor model 320, and user interface 322. Data flow 310 from virtual software environment 302 travels from user interface 322, subsystem control model 318, data conversion software 316, and API to physical layer interface 314 prior to reaching digital data bus 306.

User Interface 322 provides a graphical interface for an operator to interact with virtual software environment 302. User interface 322 provides the ability to enter commands, and to view data from subsystem 304. Virtual software environment 302 provides a generalized software platform that can be tailored to meet the needs of any specific subsystem.

Subsystem Control Model 318 is a software model of the behaviors planned for the operating software of the system to control the subsystem. As behaviors are designed during the preliminary design, they are modeled in Subsystem Control Model 318. Virtual software environment 302 provides a generalized software platform that can be tailored to meet the needs of any specific subsystem.

Subsystem Monitor Model 320 is a software model of the behaviors planned for the software of the system that will monitor and provide status for subsystem 304. Subsystem Monitor Model 320 receives command and status data from digital data bus 308 (via Data Conversion Software 316) and provides that data to User Interface 322. Virtual software environment 302 provides a generalized software platform that can be tailored to meet the needs of any specific subsystem.

Data Conversion Software 316 is an interfacing software package that converts commands and status between the digital format used by the digital data bus protocol of subsystem 304 and a protocol-independent data structure used by the subsystem models. A unique Data Conversion Software package is customized for each different type of digital data bus protocol (e.g., MIL-STD-1553, ARINC-429, ethernet). Data Conversion Software 316 uses a subsystem-specific Data Dictionary that maps subsystem model data elements into protocol-specific data elements. The Data Dictionary is modified for each subsystem to allow the Data Conversion Software to remain static across subsystems that use the same protocol. This feature supports the rapid build-up of the virtual software environment 302 for new subsystems.

API to Physical Layer Interface 314 is a hardware/software system that outputs and receives the electrical signals specific to the digital data bus protocol of subsystem 304. In some illustrative examples, API to physical layer interface 314 is purchased and then integrated with custom Data Conversion Software 316.

In some illustrative examples, the virtual software environment is developed using software that allows non-software professionals to develop emulation logic and algorithms efficiently, and supports rapid change during interface control document validation. The virtual software environment includes a variety of tools that support efficient customization for different subsystem designs. Interfaces that can be utilized in the virtual software environment include MIL-STD-1553, ARINC-429, and ethernet. The virtual software environment can be easily modified to utilize different interface timing and processing rates to accurately emulate the planned system behavior. As an added benefit, this element of the virtual software environment can be utilized later, when the full system is brought together for testing.

Figure 4:
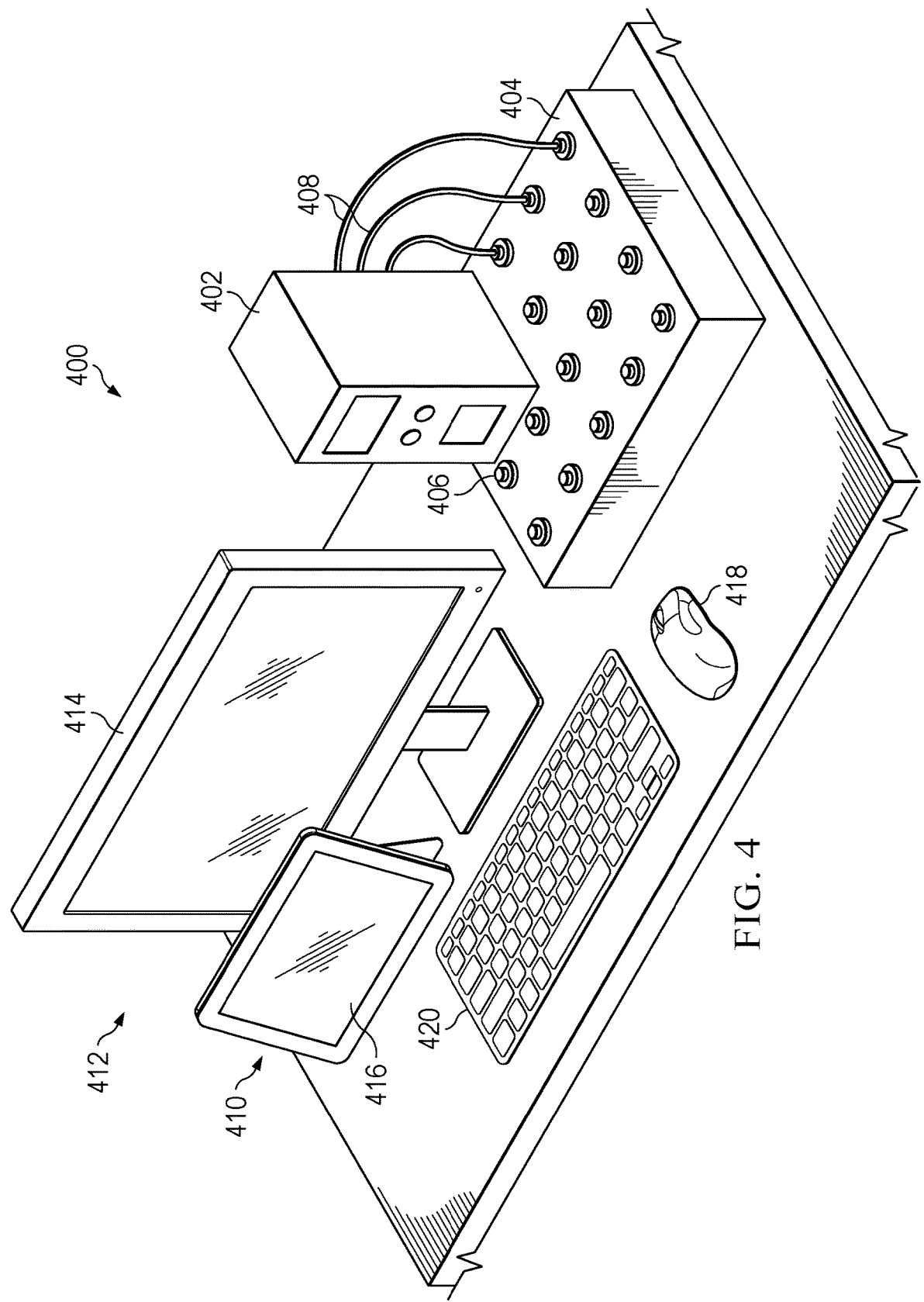
FIG. 4 is an illustration of a testing environment in accordance with an illustrative embodiment.

Turning now to FIG. 4, an illustration of a testing environment is depicted in accordance with an illustrative embodiment. Testing environment 400 is a physical implementation of testing environment 102 of FIG. 1 or testing environment 200 of FIG. 2. In testing environment 400, subsystem 402 is resting on test rig 404. Test rig 404 includes utility connections 406. Plurality of wires 408 connect subsystem 402 to test rig 404. Plurality of wires 408 provide utilities from test rig 404 to subsystem 402. In some illustrative examples, connecting plurality of wires 408 from test rig 404 to virtual software environment 410 creates a communication connection between subsystem 402 and the virtual software environment 410. In some other illustrative examples, a wireless connection forms a communication connection between subsystem 402 and virtual software environment 410.

Virtual software environment 410 is present within computer 412. Virtual software environment 410 is connected to subsystem 402 by plurality of wires 408.

In testing environment 400, virtual software environment 410 provides data to display 414. An operator can provide input to virtual software environment 410 using graphical user interface 416. An operator can provide input to virtual software environment 410 using one of mouse 418 or keyboard 420. In other illustrative examples, user input can be received through another type of input device, such as a touch screen.

Although not depicted in FIG. 4, a video camera can be present in testing environment 400. In some illustrative examples, a video camera is configured to record results of testing subsystem 402. In some illustrative examples, a video camera is directed to record subsystem 402. In some illustrative examples, a video camera is directed to record display 414 and subsystem 402.

Although not depicted in FIG. 4, an external non-digital stimulator can be present in testing environment 400. In some illustrative examples, an external non-digital stimulator is configured to generate a stimulus for subsystem 402.

Figure 5A:
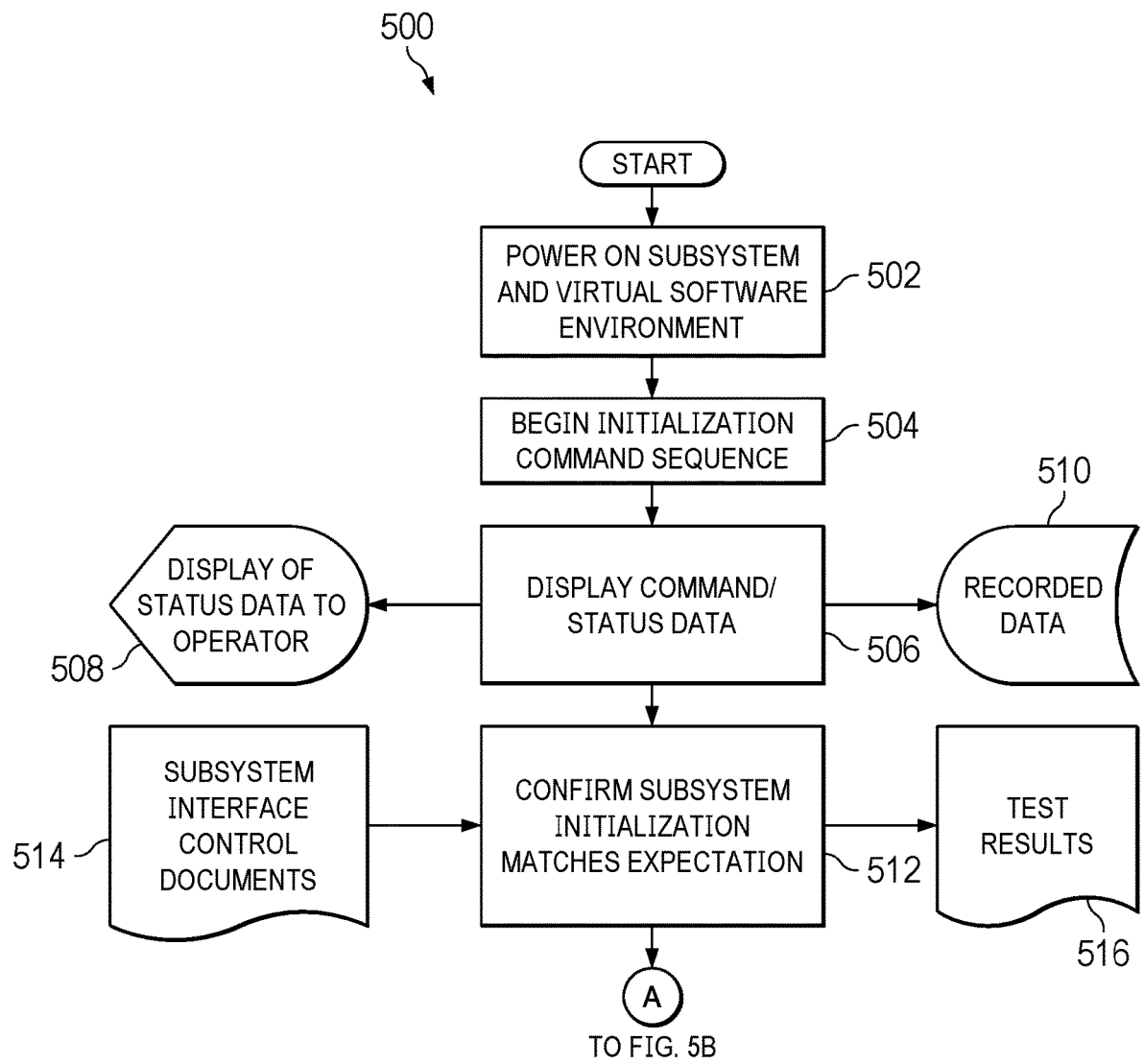
FIGS. 5A and 5B are a flowchart of a method of validating an interface control document of a subsystem in accordance with an illustrative embodiment.
Figure 5B:
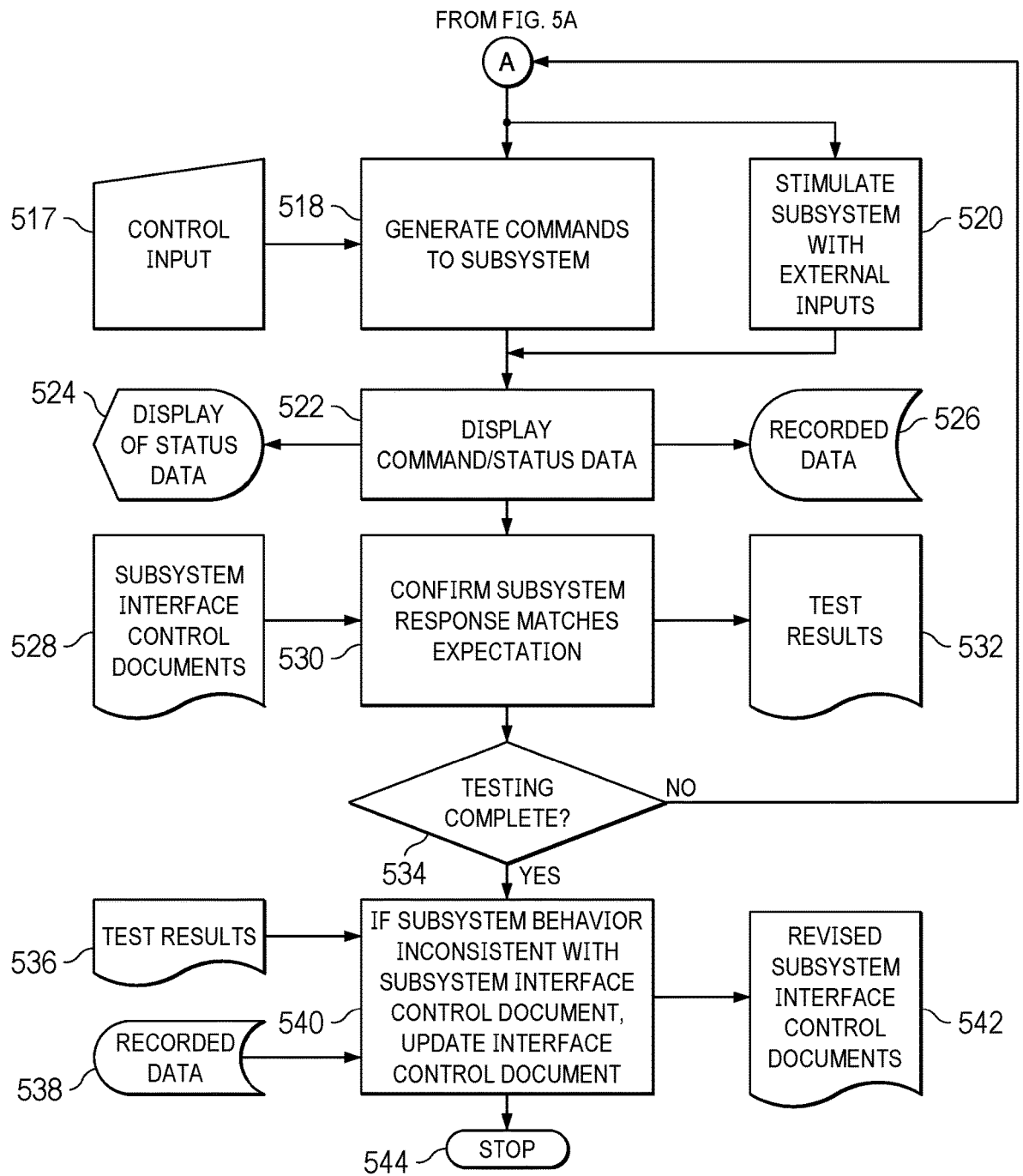

Turning now to FIGS. 5A and 5B, a flowchart of a method of validating an interface control document of a subsystem is depicted in accordance with an illustrative embodiment.

Method 500 can be used to validate an interface control document of subsystem 100 of FIG. 1. Method 500 can be used to validate an interface control document of subsystem 204 of FIG. 2. Method 500 can be implemented using virtual software environment 302 of FIG. 3. Method 500 can be used to validate an interface control document of subsystem 402 of FIG. 4.

FIGS. 5A and 5B provide a flowchart for an illustrative example of an Interface Control Document validation test. Method 500 uses a virtual software environment, such as virtual software environment 108 of FIG. 1 or virtual software environment 210 of FIG. 2, to initialize the subsystem and command the subsystem. The subsystem and virtual software environment are powered on in operation 502. The virtual software environment begins initialization command sequence in operation 504.

The subsystem receives the commands and reacts to the virtual software environment with status data in operation 506. The virtual software environment graphically depicts the command and the status digital data in operation 508. In some illustrative examples, the graphical displays are tailored to support validation of the subsystem's behavior against the subsystem interface control document.

In some illustrative examples, the virtual software environment provides real-time graphical data on a large monitor that can be viewed by multiple engineers in a collaborative environment. In some illustrative examples, real-time data is displayed with graphics, allowing engineers to collaboratively assess the system behaviors in-real-time and adjust the test, if desired. In some illustrative examples, data is recorded in operation 510 to be analyzed post-test.

Method 500 confirms the subsystem initialization matches the expectation in operation 512. To determine if the subsystem initialization is as expected, method 500 utilizes the subsystem interface control documents 514. Method 500 produces test results 516 from determining if the initialization matches the expectation.

Operation 502 through operation 516 are for an initialization test of the subsystem. System initialization is the process of starting the subsystem from a powered-off condition and allowing the subsystem to progress through its startup sequence. Each subsystem has a specified amount of time to complete initialization. Subsystem initialization timing is a significant interface characteristic that is tested during interface control document validation.

After performing the initialization test, the operation of the subsystem is then tested in operation 518 through operation 544. Operation tests for the subsystem are performed based on a subsystem type, subsystem inputs, subsystem outputs, and operational conditions of the system and the subsystem.

In order to test other results of the subsystem against the interface control document, control input 517 is provided to generate commands to the subsystem in operation 518. In some illustrative examples, control input 517 is generated by an operator. In some illustrative examples, control input 517 is generated by an algorithm or computer program. In operation 518 the virtual software environment generates the commands to the subsystem. In some illustrative examples, the subsystem is also stimulated with external inputs in operation 520 as the commands are sent to the subsystem. In some illustrative examples, an external non-digital stimulator is configured to generate a stimulus for the subsystem. External inputs can include at least one of mechanical input, test set input, RF energy, motion, heat, or any other type of external input. In some of these illustrative examples, each of these external inputs can be considered a stimulus. In some illustrative examples, the virtual software environment emulates external inputs to stimulate the subsystem.

The virtual software environment displays the command and status data in operation 522. The virtual software environment displays the status data in operation 524. In some illustrative examples, the status data is displayed on a large screen within the testing environment for real-time analysis and data review by a team of collaborating engineers. The virtual software environment records data in operation 526. The recorded data can be reviewed later for the status of the subsystem in response to the commands.

The interface control documents (ICDs) specific to the subsystem are provided in operation 528. A determination made in operation 530 confirms whether the subsystem response matches an expectation based on the interface control documents. Test results are generated in operation 532. In some illustrative examples, the virtual software environment records the output of the subsystem in data storage.

In operation 534 it is determined if all testing of the subsystem has been completed. If additional testing is remaining, method 500 returns to position A to repeat operation 517 through operation 534. Operation 517 through operation 534 are repeated iteratively until all desired tests are run on the subsystem.

If all testing has been completed at operation 534, method 500 moves to operation 540. To perform operation 540, test results are provided in operation 536 and recorded data is provided in operation 538. Using the test results and the recorded data, if the subsystem behavior is inconsistent with the interface control documents for the subsystem, the interface control document is updated in operation 540. Revised subsystem interface control documents are generated in operation 542. Afterwards, method 500 terminates in operation 544.

Figure 6:
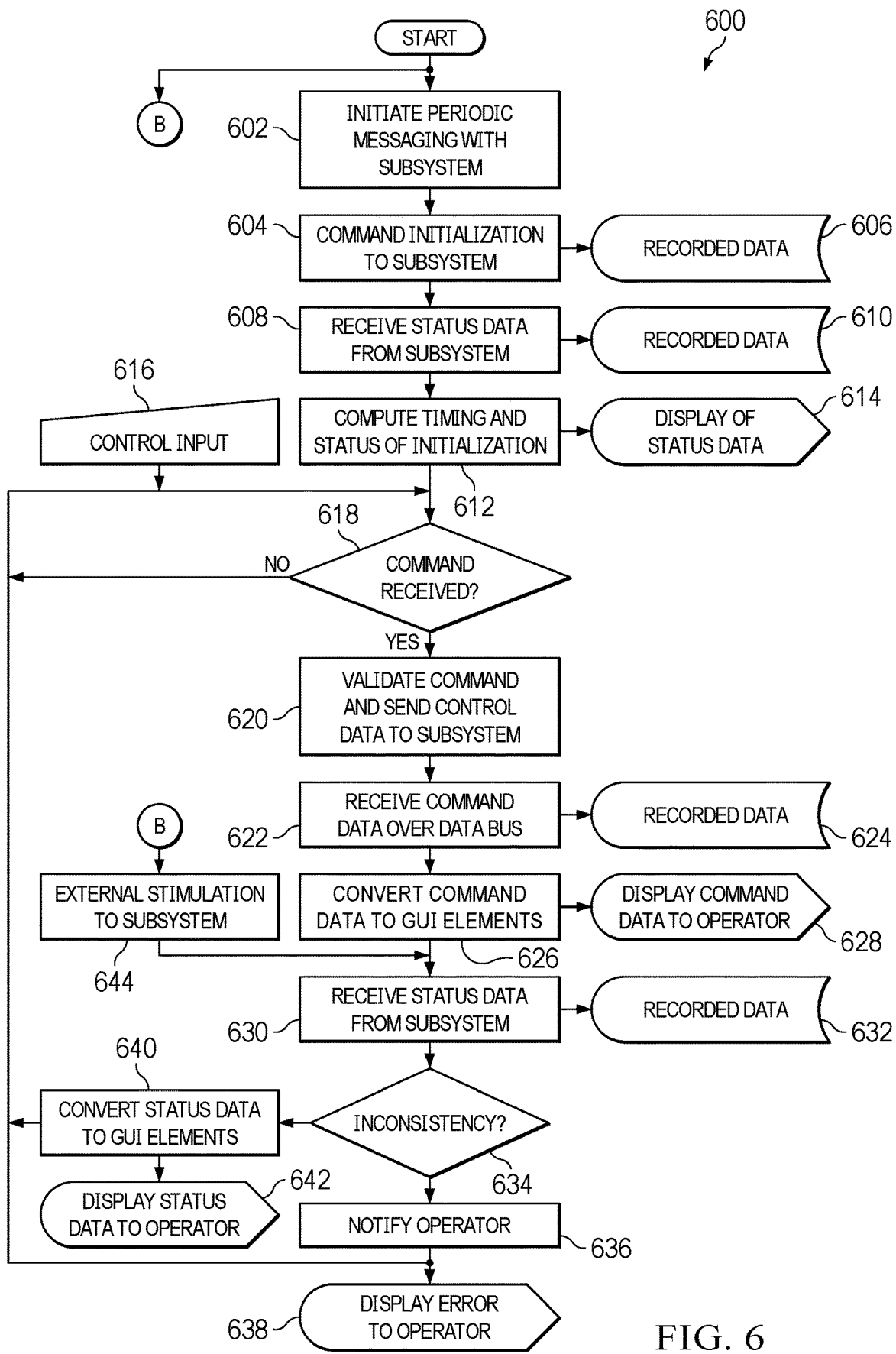
FIG. 6 is a flowchart of operating a virtual software environment in accordance with an illustrative embodiment.

Turning now to FIG. 6, a flowchart of operating a virtual software environment is depicted in accordance with an illustrative embodiment. Method 600 can be used to operate virtual software environment 108 of FIG. 1 in validating an interface control document of subsystem 100. Method 600 can be performed by virtual software environment 210 of FIG. 2 to validate an interface control document of subsystem 204 of FIG. 2. Method 600 can be implemented using virtual software environment 302 of FIG. 3. Method 600 can be used by virtual software environment 410 to validate an interface control document of subsystem 402 of FIG. 4.

Operation 602 through operation 614 involve testing the subsystem initialization. Subsystem initialization is the process of starting the subsystem from a powered-off condition and allowing the subsystem to progress through its startup sequence. Each subsystem has a specified amount of time to complete initialization. Subsystem initialization timing is a significant interface characteristic that is tested during Interface Control Document validation.

Most subsystems perform a startup test during initialization, and then report the results to the operating software, which is represented by the Virtual Software Environment during Interface Control Document validation. The subsystem's startup test behaviors and reported results are evaluated during interface control document validation.

Often, subsystems utilize a sequenced digital handshake with the operating software to complete the startup sequence. These sequenced handshakes are thoroughly tested during interface control document validation to ensure that the subsystem behaviors and the behaviors required of the operating software are well understood. An example of a digital handshake during subsystem startup includes power applied signal from system power, startup test in progress from subsystem, startup test status from subsystem, installation configuration command from operating software, acknowledge configuration command from subsystem, and ready to accept commands from subsystem.

In operation 602 the virtual software environment initiates periodic messaging with the subsystem. In operation 604 the virtual software environment sends a command initialization to the subsystem and records data in operation 606. The data recorded in operation 606 includes the command sent to the subsystem. In operation 608 the virtual software environment receives status data from the subsystem after initialization. The virtual software environment records the data at operation 610. The data includes the status data output from the subsystem.

In operation 612 the timing and status of initialization is computed. The test results from the timing and status of initialization are displayed in operation 614.

Operations 602-614 tests the initialization of the subsystem. Afterwards, the virtual software environment waits for control input to be provided to test the subsystem. In operations 620-644, the virtual software environment performs testing of a subsystem to validate the interface control documents of the subsystem. The control input can test each aspect of the interface control documents for the subsystem individually. Testing of the subsystem can include testing operating conditions of the subsystem. In some illustrative examples, testing can include injecting faults with the test rig to evaluate subsystem behaviors.

Control input is provided in 616. After the virtual software environment determines a command is received at operation 618, the virtual software environment validates the command and sends the control data to the subsystem in operation 620

The virtual software environment receives command data over a data bus in operation 622. The data is recorded for the received command data in operation 624. The command data is converted to graphical user interface (GUI) elements in operation 626. The command data is displayed to an operator in operation 628.

Status data is received from the subsystem in response to the command in operation 630. The status data is recorded by the virtual software environment in operation 632. In operation 634, the virtual software environment determines if there is an inconsistency in the status data received from the subsystem. An inconsistency is present in the status data when the status data deviates from an expected result based on the interface control documents of the subsystem.

If an inconsistency is detected at operation 634, an operator is notified in operation 636. The inconsistency is displayed to the operator in operation 638. In some illustrative examples, the operator is notified in operation 636 by displaying a notification in the graphical user interface of the virtual software environment. In some illustrative examples, the inconsistency is displayed in operation 638 by displaying the status data and the expected outcome in the graphical user interface of the virtual software environment. After the inconsistency is displayed to an operator, method 600 returns to operation 618 to await control input 616 to test additional aspects of the interface control documents of the subsystem.

If an inconsistency is not present in operation 634, the status data is converted to graphical user interface (GUI) elements operation 640. In operation 642 the status data is displayed to an operator. After the status data is displayed to an operator, method 600 returns to operation 618 to await control input 616 to test additional aspects of the interface control documents of the subsystem.

Figure 7:
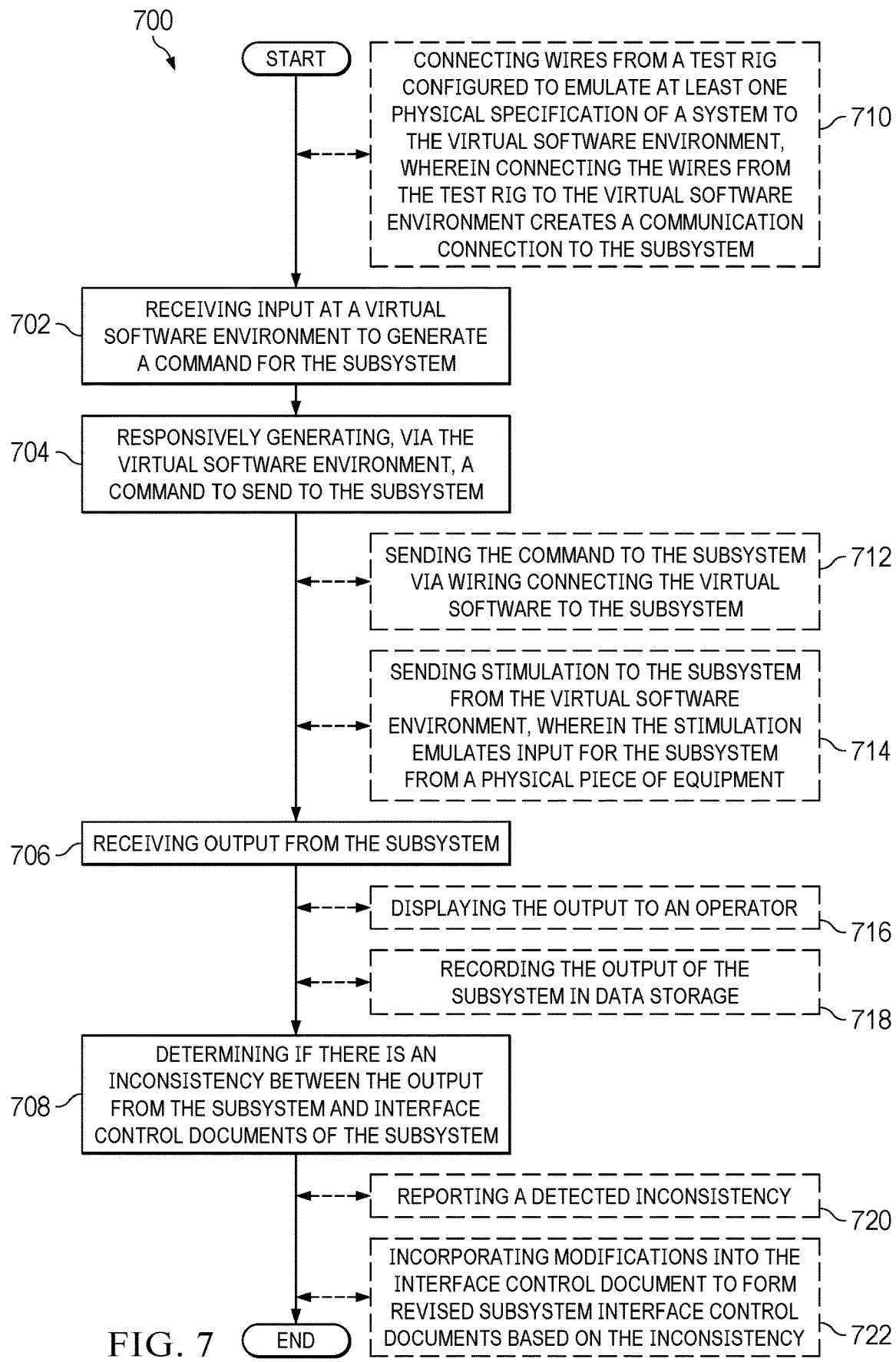
FIG. 7 is a flowchart of a method of testing a subsystem in accordance with an illustrative embodiment.

Turning now to FIG. 7, a flowchart of a method of testing a subsystem is depicted in accordance with an illustrative embodiment. Method 700 can be performed using test rig 106 and virtual software environment 108 of FIG. 1. Method 700 can be performed using testing system 202 of FIG. 2. Method 700 can be performed using virtual software environment 302 of FIG. 3. Method 700 can be performed using test rig 404 and virtual software environment 410 of FIG. 4.

Method 700 receives input at a virtual software environment to generate a command for the subsystem (operation 702). Method 700 responsively generates, via the virtual software environment, a command to send to the subsystem (operation 704). Method 700 receives output from the subsystem (operation 706). Method 700 determines if there is an inconsistency between the output from the subsystem and interface control documents of the subsystem (operation 708). Afterwards, method 700 terminates.

In some illustrative examples, method 700 connects wires from a test rig configured to emulate at least one physical specification of a system to the virtual software environment, wherein connecting the wires from the test rig to the virtual software environment creates a communication connection to the subsystem (operation 710). In some illustrative examples, method 700 sends the command to the subsystem via wiring connecting the virtual software environment to the subsystem (operation 712). In some illustrative examples, method 700 sends stimulation to the subsystem from the virtual software environment, wherein the stimulation emulates input for the subsystem from a physical piece of equipment (operation 714). In some illustrative examples, method 700 displays the output to an operator (operation 716). In some illustrative examples, method 700 records the output of the subsystem in data storage (operation 718).

In some illustrative examples, method 700 reports a detected inconsistency (operation 720). In some illustrative examples, method 700 incorporates modifications into the interface control document to form revised subsystem interface control documents based on the inconsistency (operation 722).

Figure 8:
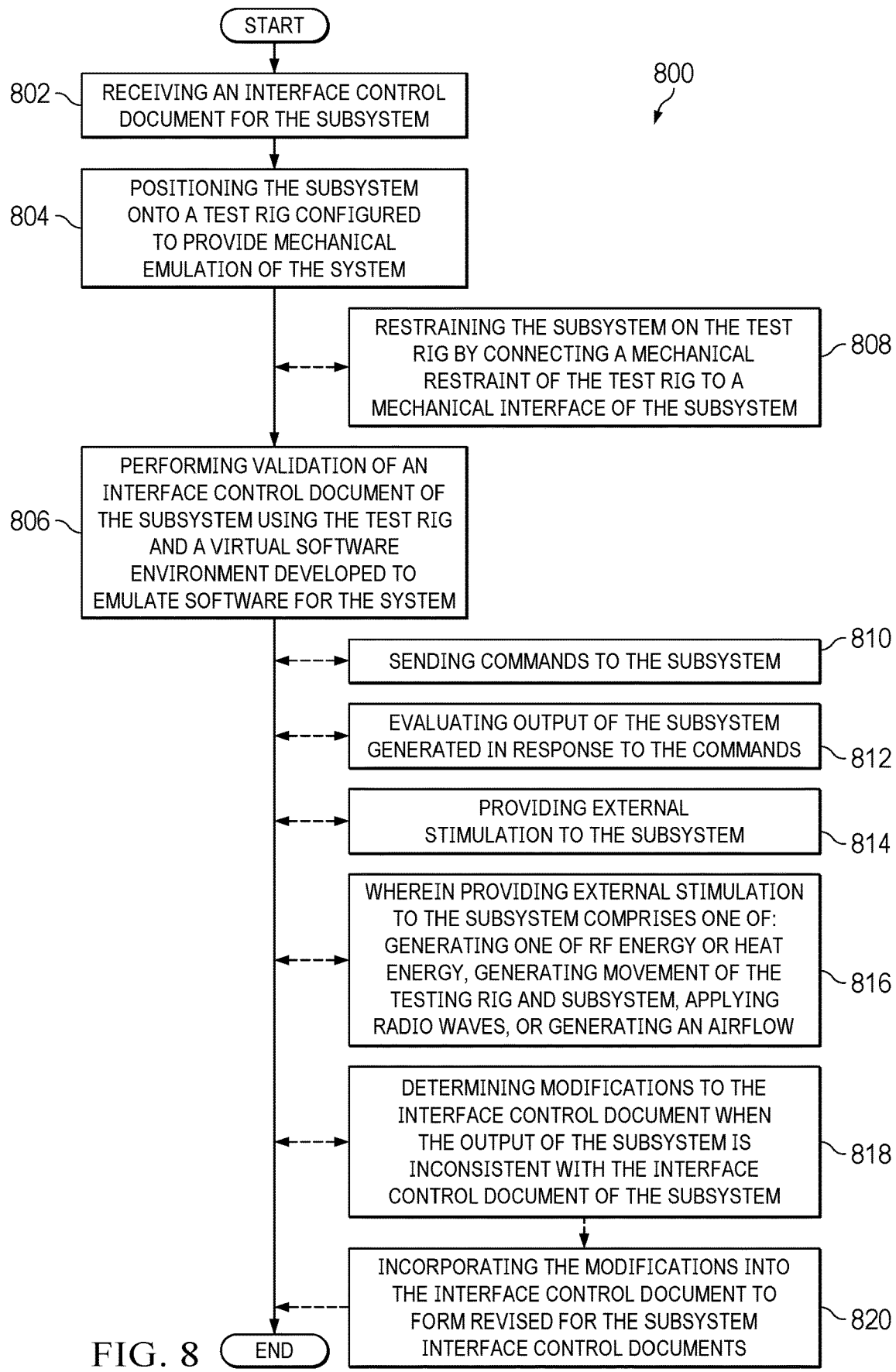
FIG. 8 is a flowchart of a method of testing a subsystem prior to installation in a system in accordance with an illustrative embodiment.

Turning now to FIG. 8, a flowchart of a method of testing a subsystem prior to installation in a system is depicted in accordance with an illustrative embodiment. Method 800 can be performed using test rig 106 and virtual software environment 108 of FIG. 1. Method 800 can be performed using testing system 202 of FIG. 2. Method 800 can be performed using virtual software environment 302 of FIG. 3. Method 800 can be performed using test rig 404 and virtual software environment 410 of FIG. 4.

Method 800 receives an interface control document for the subsystem (operation 802). Method 800 positions the subsystem onto a test rig configured to provide mechanical emulation of the system (operation 804). Method 800 performs validation of an interface control document for the subsystem using the test rig and a virtual software environment developed to emulate software for the system (operation 806). Afterward, method 800 terminates.

In some illustrative examples, method 800 further comprises restraining the subsystem on the test rig by connecting a mechanical restraint of the test rig to a mechanical interface of the subsystem (operation 808). The mechanical restraint can take any desirable form. In some illustrative examples, the mechanical restraint comprises a number of fasteners.

In some illustrative examples, performing validation of the interface control document of method 800 comprises sending commands to the subsystem (operation 810). In some illustrative examples, performing validation of the interface control document of method 800 further comprises evaluating output of the subsystem generated in response to the commands (operation 812).

In some illustrative examples, performing validation of the interface control document of method 800 comprises providing external stimulation to the subsystem (operation 814). In some illustrative examples, providing external stimulation to the subsystem comprises one of: generating one of RF energy or heat energy, generating movement of the test rig and subsystem, applying radio waves, or generating an airflow (operation 816).

In some illustrative examples, performing validation of the interface control document of method 800 further comprises determining modifications to the interface control document when the output of the subsystem is inconsistent with the interface control document for the subsystem (operation 818). In some illustrative examples, method 800 incorporates the modifications into the interface control document to form revised subsystem interface control documents.

As used herein, the phrase "at least one of," when used with a list of items, means different combinations of one or more of the listed items may be used and only one of each item in the list may be needed. For example, "at least one of item A, item B, or item C" may include, without limitation, item A, item A and item B, or item B. This example also may include item A, item B, and item C or item B and item C. Of course, any combinations of these items may be present. In other examples, "at least one of" may be, for example, without limitation, two of item A; one of item B; and ten of item C; four of item B and seven of item C; or other suitable combinations. The item may be a particular object, thing, or a category. In other words, at least one of means any combination items and number of items may be used from the list but not all of the items in the list are required.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent at least one of a module, a segment, a function, or a portion of an operation or step.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram. Some blocks may be optional. For example, any of operation 710 through operation 722 may be optional. As another example, any of operation 808 through operation 820 may be optional. As another example, any of operation 1012 through operation 1024 of FIG. 10 may be optional.

Figure 9:
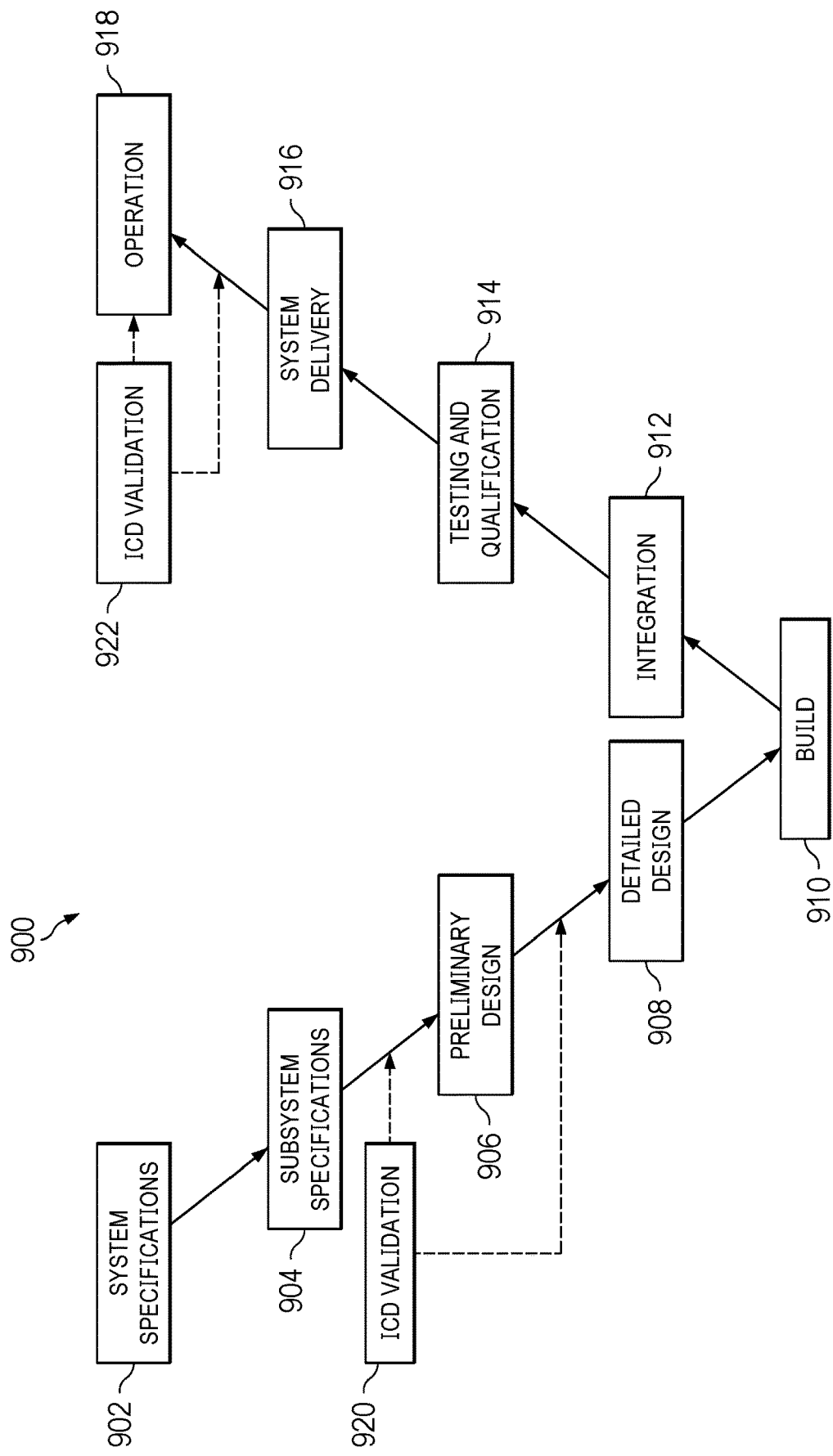
FIG. 9 is an illustration of a systems design flow with interface control document validation in accordance with an illustrative embodiment.

Turning now to FIG. 9, an illustration of a systems design flow with interface control document validation is depicted in accordance with an illustrative embodiment. Test rig 106 and virtual software environment 108 of FIG. 1 enable interface control document validation within design flow 900. Testing system 202 of FIG. 2 enables interface control document validation within design flow 900. Virtual software environment 302 of FIG. 3 enables interface control document validation within design flow 900. Test rig 404 and virtual software environment 410 of FIG. 4 can perform interface control document validation within design flow 900. Method 500 of FIG. 5 can be used to validate an interface control document in design flow 900. Method 600 of FIG. 6 can be used to validate an interface control document in design flow 900.

In design flow 900, system specifications 902 are set. The system specifications 902 can be set based on customer requests, performance goals, and regulatory conditions. After setting system specifications 902, subsystem specifications 904 are generated. In conventional design processes, the design would continue through preliminary design 906, detailed design 908, and build 910 of the components and subcomponents of the system. In conventional design processes, validation of interface control documents of a subsystem is performed in testing and qualification 914 after integration 912. In conventional design processes, validation of interface control documents can introduce undesirable delays for inconsistencies between the behavior of the subsystem and the interface control documents for the subsystem.

In design flow 900, interface control document (ICD) validation 920 can be performed after subsystem specifications 904. In some illustrative examples, in design flow 900, interface control document (ICD) validation 920 can be performed after preliminary design 906. By performing interface control document validation 920 prior to detailed design 908, design time can be reduced. By performing interface control document validation 920 prior to detailed design 908, design can be reduced by reducing redesign due to interface control document inconsistencies. By performing interface control document validation 920 prior to detailed design 908, interface control document validation 920 can improve technical quality, leading to cost savings and schedule gains.

In some illustrative examples, in design flow 900, interface control document (ICD) validation 922 can be performed after system delivery 916. In some illustrative examples, in design flow 900, interface control document (ICD) validation 922 can be performed after operation 918. In some illustrative examples, interface control document (ICD) validation 922 is performed for an after-market component for the system. In some illustrative examples, interface control document (ICD) validation 922 is performed for a replacement component for the system. By providing emulation of subsystems of the system, interface control document validation 922 can reduce downtime of the system. For example, the system can remain in operation 918 while the interfaces of the subsystem are tested.

Figure 10:
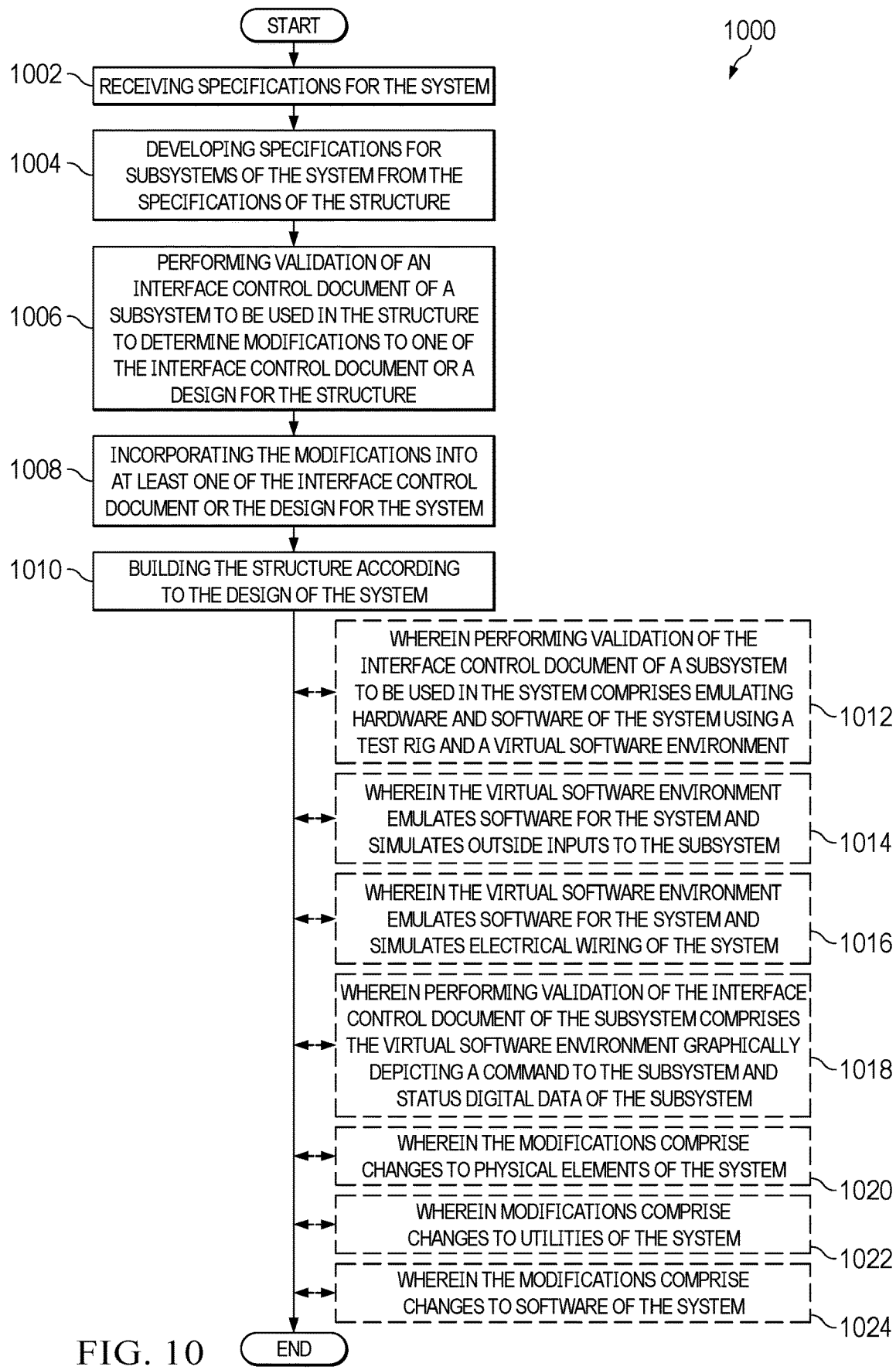
FIG. 10 is a flowchart of a method of testing a subsystem prior to installation in a system in accordance with an illustrative embodiment.

Turning now to FIG. 10 is a flowchart of a method of testing a subsystem prior to installation in a system is depicted in accordance with an illustrative embodiment. Method 1000 can be performed using test rig 106 and virtual software environment 108 of FIG. 1. Method 1000 can be performed using testing system 202 of FIG. 2. Method 1000 can be performed using virtual software environment 302 of FIG. 3. Method 1000 can be performed using test rig 404 and virtual software environment 410 of FIG. 4.

Method 1000 receives specifications for the system (operation 1002). Method 1000 develops specifications for subassemblies of the system from the specifications of the system (operation 1004). Method 1000 performs validation of an interface control document of a subsystem to be used in the system to determine modifications to one of the interface control document or a design for the system (operation 1006). Method 1000 incorporates the modifications into at least one of the interface control document or a design for the system (operation 1008). Afterwards, method 1000 terminates.

In some illustrative examples, method 1000 builds the system according to the design of the system (operation 1010). In some illustrative examples, performing validation of interface control document of a subsystem to be used in the system comprises emulating hardware and software of the system using a test rig and a virtual software environment (operation 1012).

In some illustrative examples, the virtual software environment emulates software for the system and simulates outside inputs to the subsystem (operation 1014). In some illustrative examples, the virtual software environment emulates software for the system and simulates electrical wiring of the system (operation 1016). In some illustrative examples, performing validation of interface control document of a subsystem comprises the virtual software environment graphically depicting a command to the subsystem and status data of the subsystem (operation 1018).

In some illustrative examples, the modifications comprise changes to physical elements of the system (operation 1020). In some illustrative examples, the modifications comprise changes to utilities of the system (operation 1022). In some illustrative examples, the modifications comprise changes to software of the system (operation 1024).

Figure 11:
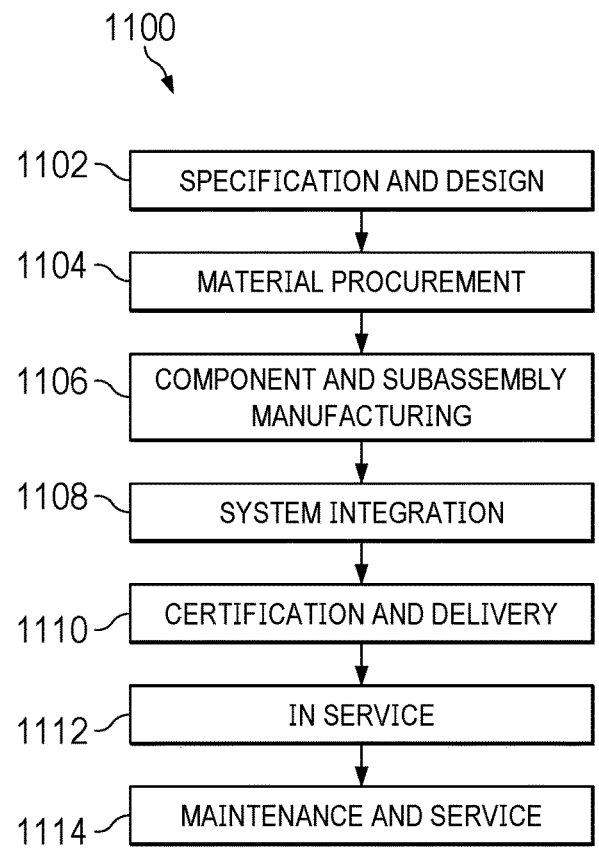
FIG. 11 is an illustration of an aircraft manufacturing and service method in a form of a block diagram in accordance with an illustrative embodiment.
Figure 12:
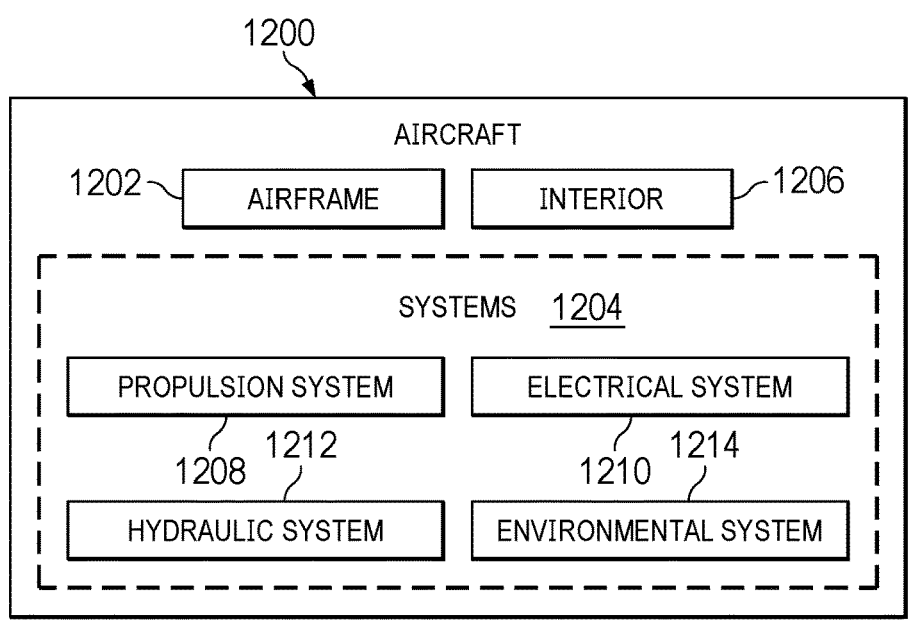
FIG. 12 is an illustration of an aircraft in a form of a block diagram in which an illustrative embodiment may be implemented.

Illustrative embodiments of the present disclosure may be described in the context of aircraft manufacturing and service method 1100 as shown in FIG. 11 and aircraft 1200 as shown in FIG. 12. Turning first to FIG. 11, an illustration of an aircraft manufacturing and service method is depicted in accordance with an illustrative embodiment. During pre-production, aircraft manufacturing and service method 1100 may include specification and design 1102 of aircraft 1200 in FIG. 12 and material procurement 1104.

During production, component and subsystem manufacturing 1106 and system integration 1108 of aircraft 1200 takes place. Thereafter, aircraft 1200 may go through certification and delivery 1110 in order to be placed in service 1112. While in service 1112 by a customer, aircraft 1200 is scheduled for routine maintenance and service 1114, which may include modification, reconfiguration, refurbishment, or other maintenance and service.

Each of the processes of aircraft manufacturing and service method 1100 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 12, an illustration of an aircraft is depicted in which an illustrative embodiment may be implemented. In this example, aircraft 1200 is produced by aircraft manufacturing and service method 1100 of FIG. 11 and may include airframe 1202 with plurality of systems 1204 and interior 1206. Examples of systems 1204 include one or more of propulsion system 1208, electrical system 1210, hydraulic system 1212, and environmental system 1214. Any number of other systems may be included.

Apparatuses and methods embodied herein may be employed during at least one of the stages of aircraft manufacturing and service method 1100. One or more illustrative embodiments may be manufactured or used during at least one of component and subassembly manufacturing 1106, system integration 1108, in service 1112, or maintenance and service 1114 of FIG. 11.

The illustrative examples fundamentally change the traditional systems engineering V that has been used for decades on complex programs. By pulling specific testing from the far right hand side of the V to the upper left side of the V, critical knowledge is gained regarding the subsystems that are to be integrated, and the design can then be created with much greater quality and safety margins than previously achieved. While the illustrative examples pull activity to the far left, this new process is not prototyping or agile or subsystem qualification or subsystem verification.

The illustrative examples move the interface discovery process to the beginning of the program, prior to design, so the findings can be used to inform the design effort. The illustrative examples allow for a full knowledge base about the new subsystems during the design. Specifically, the illustrative examples perform targeted tests on a new subsystem. These tests are used to finalize detailed interface requirements that then flow into the design.

The illustrative examples involve testing of software, with a virtual module emulating a system, coupled to a subsystem. The illustrative examples include providing input to the virtual module of a command (e.g., initialization) for the subsystem component, and responsively generating, via the virtual module, an output sent via the wiring to the subsystem component.

The illustrative examples determine if there is an inconsistency between the subsystem output and a unique interface control document. The illustrative examples report the detected inconsistency and update or correct the unique interface control document (ICD), if necessary.

In some illustrative examples, the interface control document validation environment consists of five elements: (1) a mechanical rig containing the subsystem (2) electrical wiring that is based on the preliminary design for the subsystem, (3) external non-digital stimulation, such as RF energy or mechanical stimulation, that simulates outside inputs, and (4) a virtual software environment that emulates the behaviors of the integrating hardware/software in accordance with the subsystem-unique interface control document and displays interface data during test, and (5) video and/or digital data recording that may be used post-test to analyze subsystem behavior.

The illustrative examples present interface control document validation tests. The test uses the virtual software environment to initialize the subsystem and command the subsystem. The subsystem receives the commands and reacts to the virtual software environment with status data. The virtual software environment graphically depicts the command and the status digital data. The graphical displays are tailored to support validation of the subsystem's behavior against the system-unique interface control document.

The virtual software environment provides real-time graphical data on a large monitor that can be viewed by multiple operators in a collaborative environment. Real-time data displayed with meaningful graphics, instead of recorded data that must be analyzed post-test, allows the operators to collaboratively assess the system behaviors immediately and adjust the test, as desired. As an added benefit, this element of the virtual software environment can be utilized later, when the full system is brought together for testing.

The illustrative examples provide testing with a virtual module emulating hardware/system-software that is coupled to a subsystem. The illustrative examples provide input to the virtual module of a command (e.g., initialization) for the subsystem component; responsively generate, via the virtual module, an output sent via the wiring to the subsystem component; determine if there is an inconsistency between the subsystem output and a unique ICD; and report the detected inconsistency and updating/correcting the unique ICD if needed. The illustrative examples improve technical quality, leading to cost savings and schedule gains.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A testing system configured to test a subsystem prior to completion of a design or assembly into a system, wherein the testing system comprises:
a test rig that comprises electrical wiring and a mechanical restraint configured to emulate at least one physical specification of the system and connect the test rig to the subsystem; and
a virtual software environment separate from and in communication with the test rig and developed to emulate operating software for subsystems, of the system, planned to interface with the subsystem connected to the test rig, wherein the virtual software environment comprises:
a software emulation, of the subsystems of the system planned to interface with the subsystem after the system is built, configured for modification in real time while the subsystem is connected to the test rig; and
a hardware emulation, of the subsystems of the system planned to interface with the subsystem after the system is built, configured for modification in real time while the subsystem is connected to the test rig.

2. The testing system of claim 1 further comprising:
the software emulation configured to emulate: a timing, an interface data structure, a control algorithm, and display capabilities of software planned for the operating software in the subsystems of the system planned to interface with the subsystem; and
a video camera configured to record results of testing the subsystem.

3. The testing system of claim 1 further comprising:
an external non-digital stimulator configured to generate a stimulus for the subsystem that comprises an X-ray.

4. The testing system of claim 3, wherein:
the subsystems planned to interface with the subsystem are unbuilt; and
the external non-digital stimulator is configured to generate RF energy.

5. The testing system of claim 1, wherein the test rig further comprises:
kinetic components configured to generate movement of the test rig and subsystem; and
thermodynamic components configured to emulate operational thermodynamic conditions of the system, wherein the thermodynamic components are configured to provide thermal management of the subsystem, wherein the thermodynamic components provide heating and cooling to emulate operational conditions of the system, and wherein the thermodynamic components provide heating and cooling to provide thermal management of the subsystem.

6. The testing system of claim 1, wherein the test rig further comprises kinetic components configured to emulate motions of the system while the system is in operation.

7. The testing system of claim 1, wherein the virtual software environment is further configured to provide emulation of at least one element of status data from a component of the system or commands from a component of the system.

8. The testing system of claim 1, wherein the virtual software environment is configured to emulate software logic and algorithms that have not yet been coded in operating software of the subsystems of the system planned to interface with the subsystem.

9. A method of testing a subsystem prior to completing a design or an installation of the subsystem in a system, the method comprising:
receiving an interface control document for the subsystem;
connecting the subsystem onto a mechanical restraint of a test rig configured to provide mechanical emulation of the system; and
performing validation of the interface control document for the subsystem using the test rig and a virtual software environment separate from and communicating with the test rig and emulating software and hardware for the subsystems of the system planned to interface with the subsystem after the system is built, wherein the virtual software environment comprises:
a software emulation, of the subsystems of the system planned to interface with the subsystem, modifiable in real time while the subsystem is connected to the test rig; and
a hardware emulation, of the subsystems of the system planned to interface with the subsystem, modifiable in real time while the subsystem is connected to the test rig.

10. The method of claim 9 wherein performing validation of the interface control document comprises:
sending commands to the subsystem;
evaluating output of the subsystem generated in response to the commands; and
determining modifications to the interface control document when the output of the subsystem is inconsistent with the interface control document for the subsystem.

11. The method of claim 10, further comprising:
incorporating the modifications into the interface control document to form revised subsystem interface control documents;
modifying, using results of testing the subsystem connected to the test rig while the subsystem is connected to the test rig, the virtual software environment emulating the subsystems planned for interfacing with the subsystem after the system is built; and
subsequently retesting the subsystem connected to the test rig with a modified virtual software environment.

12. The method of claim 9, further comprising the test rig comprising thermodynamic components emulating operational thermodynamic conditions of the system and providing thermal management of the subsystem, wherein the thermodynamic components provide heating and cooling emulating operational conditions of the system, and wherein the thermodynamic components provide heating and cooling providing thermal management of the subsystem.

13. The method of claim 9 wherein performing validation of the interface control document comprises:
providing external stimulation to the subsystem.

14. The method of claim 13, wherein providing external stimulation to the subsystem comprises at least one of: generating RF energy, generating movement of the test rig and subsystem, applying radio waves, and generating an airflow.

15. The method of claim 9, wherein positioning the subsystem onto a test rig configured to provide mechanical emulation of the system comprises:
connecting wires from a test rig configured to emulate at least one physical specification of a system to the virtual software environment, wherein connecting the wires from the test rig to the virtual software environment creates a communication connection to the subsystem.

16. The method of claim 9 further comprising:
sending stimulation to the subsystem from the virtual software environment, wherein the stimulation emulates input for the subsystem from a physical piece of equipment.

17. The method of claim 9, wherein performing validation comprises performing validation of the interface control document of the subsystem to be used in the system to determine modifications to one of the interface control document or a design for the system, the method further comprising:
incorporating the modifications into at least one of the interface control document or a design for the system; and
building the system according to the design of the system.

18. The method of claim 17, wherein the modifications comprise changes to physical elements of the system.

19. The method of claim 17, wherein the modifications comprise changes to utilities of the system.

20. The method of claim 17, wherein the modifications comprise changes to software of the system.

21. The method of claim 17, wherein the virtual software environment emulates software for the system and simulates outside inputs to the subsystem.

22. The method of claim 17, wherein the virtual software environment emulates software for the system and simulates electrical wiring of the system.

23. The method of claim 17, wherein performing validation of the interface control document of a subsystem comprises the virtual software environment graphically depicting a command to the subsystem and status data of the subsystem.

24. A method of testing a subsystem prior to completion of a design or an installation in a system, the method comprising:
receiving an interface control document for the subsystem;
connecting the subsystem onto a mechanical restraint of a test rig configured to provide mechanical emulation of the system; and
performing validation of the interface control document for the subsystem using the test rig and a virtual software environment separate from and in communication with the test rig and emulating software and hardware for the subsystems, of the system planned to interface with the subsystem after the system is built, wherein the virtual software environment comprises:
a software emulation, of the subsystems of the system planned to interface with the subsystem, modifiable in real time; and
a hardware emulation, of the subsystems of the system planned to interface with the subsystem, modifiable in real time, wherein the test rig comprises thermodynamic components emulating operational thermodynamic conditions of the system, wherein the thermodynamic components are configured to provide thermal management of the subsystem, wherein the thermodynamic components provide heating and cooling to emulate operational conditions of the system, and wherein the thermodynamic components provide heating and cooling to provide thermal management of the subsystem, and
wherein performing validation of an interface control document for the subsystem comprises:
receiving input at the virtual software environment to generate a command for the subsystem;
responsively generating, via the virtual software environment, the command to send to the subsystem;
receiving output from the subsystem; and
determining if there is an inconsistency between the output from the subsystem and interface control documents of the subsystem; and
identifying design changes needed in one of the subsystems of the system emulated interfacing with the subsystem connected to the test rig and suggesting modifications to the virtual software environment for further testing of the subsystem connected to the test rig.

25. The method of claim 24 further comprising:
reporting a detected inconsistency;
modifying, using results of testing the subsystem connected to the test rig while the subsystem is connected to the test rig, the virtual software environment emulating the subsystems planned for interfacing with the subsystem after the system is built; and
subsequently retesting the subsystem connected to the test rig with a modified virtual software environment.

26. The method of claim 25 further comprising:
incorporating modifications into the interface control document to form a revised subsystem interface control document based on the inconsistency.

27. The method of claim 24 further comprising:
displaying the output to an operator.

28. The method of claim 24 further comprising:
recording the output of the subsystem in data storage.

29. The method of claim 24 further comprising:
sending the command to the subsystem via wiring connecting the virtual software environment to the subsystem.

* * * * *